United States Patent [19]

Dijkmans et al.

[11] Patent Number: 4,706,035
[45] Date of Patent: Nov. 10, 1987

[54] HIGH EFFICIENCY AMPLIFIER HAVING A BOOTSTRAP CAPACITOR

[75] Inventors: Eise C. Dijkmans; Joseph G. G. Raets, both of Eindhoven, Netherlands; Norbert J. L. Philips, Louvain, Belgium

[73] Assignee: U.S. Philips Corporation, New York, N.Y.

[21] Appl. No.: 838,728

[22] Filed: Mar. 11, 1986

[30] Foreign Application Priority Data

Mar. 18, 1985 [NL] Netherlands ............... 8500770

[51] Int. Cl.⁴ .................. H03F 1/38; H03F 3/30
[52] U.S. Cl. ........................... 330/156; 330/267; 330/297
[58] Field of Search ............. 330/156, 202, 267, 273, 330/297, 296

[56] References Cited

U.S. PATENT DOCUMENTS 3,961,280 6/1976 Sampei .................. 330/297 X
4,001,707 1/1977 Iguchi .................. 330/267

Primary Examiner—James B. Mullins
Attorney, Agent, or Firm—Robert T. Mayer; Bernard Franzblau

[57] ABSTRACT

A high-efficiency class-G type amplifier comprises a first transistor ($T_1$), having its collector connected to a first supply voltage ($V_1$) via a first diode ($D_1$) and a second transistor ($T_2$), connected in series with the first transistor and which has its collector connected to a second supply voltage ($V_2$). The series arrangement of a second ($D_2$), a third ($D_3$) and a fourth diode ($D_4$) is connected between the bases of the first and the second transistor ($T_1$, $T_2$) the fourth diode ($D_4$) is poled in a direction opposite to that of the second ($D_2$) and the third diode ($D_3$). The series arrangement of a first resistor ($R_1$) and the emitter-collector path of a first current-source transistor ($T_4$) connects the second supply voltage to the anode of the fourth diode ($D_4$). The junction point (5) between the first resistor ($R_1$) and the current-source transistor ($T_4$) is connected to the output (2) by means of a capacitor ($C_1$). This arrangment drives the output to a voltage substantially equal to the second supply voltage ($V_2$).

18 Claims, 6 Drawing Figures

HIGH EFFICIENCY AMPLIFIER HAVING A BOOTSTRAP CAPACITOR

BACKGROUND OF THE INVENTION

This invention relates to an amplifier arrangement comprising at least a first transistor having an emitter which is coupled to a first terminal for connection to a load which is coupled to a reference point, and having a collector which is coupled by means of a first semiconductor junction to a second terminal for a first supply voltage, a second transistor having a collector-emitter path which is arranged in series with the collector-emitter path of the first transistor, and having a collector which is coupled to a third terminal for a second supply voltage which is higher than the first supply voltage, and a circuit which is arranged between the base of the first transistor and the base of the second transistor and which comprises the series arrangement of at least a second semiconductor junction and a third semiconductor junction which are poled in the same direction as the base-emitter junction of the first transitor, and a fourth semiconductor junction which is poled in the same direction as the base-emitter junction of the second transistor, and an input, which is coupled to the bases of the first transistor and the second transistor, for receiving an input signal.

The invention also relates to a push-pull amplifier equipped with such an amplifier arrangement.

Such an amplifier arrangement of the class-G type may be employed as a power amplifier for audio signals. A class-G amplifier is to be understood to mean an amplifier in which the supply voltage increases in a number of steps depending on the input signal. This results in an amplifier having a high efficiency.

Such an amplifier arrangement is disclosed in U.S. Pat. No. 3,961,280. In this known arrangement the input signal is applied to the bases of the first transistor and the second transistor via a third transistor arranged as an emitter follower. For low input voltages the second transistor is cut off so that the first transistor is connected to the first supply voltage. If the input voltage becomes higher than the first supply voltage, the second transistor is turned on so that the first supply voltage is disconnected and the first transistor is coupled to the second supply voltage.

When the second transistor does not conduct, the voltage across the base-emitter junction of this transistor is at the most equal to substantially the full first supply voltage. In order to preclude breakdown of the base-emitter junction as a result of this voltage, a diode is arranged in the base line of the second transistor. In order to prevent the first transistor from being bottomed and thereby producing distortion when the second transistor is not yet fully conductive, two series-connected diodes are arranged in the base line of the first transistor.

However, a drawback of this arrangement is that it has a limited output voltage swing and, consequently, a limited efficiency. In the known arrangement the input signal is applied to the bases of the first transistor and the second transistor via a third transistor arranged as an emitter follower, which third transistor is of the same conductivity type as the first transistor and the second transistor. For the maximum output voltage the voltage on the base of the third transistor is substantially equal to the second supply voltage. The voltage on the output is then equal to the second supply voltage minus the sum of the base-emitter voltages of the first transistor and the third transistor and the diode voltages across the two diodes arranged in the base line of the first transistor.

SUMMARY OF THE INVENTION

It is an object of the invention to improve the known amplifier arrangement of the class-G type in such a way that the arrangement has a larger output voltage swing and hence a higher efficiency. In accordance with the invention an arrangement of the type specified in the opening paragraph is characterized in that the third terminal is coupled to a point between the third semiconductor junction and the fourth semiconductor junction by means of the series arrangement of a first resistor and a first current source, and a capacitor is coupled between the first terminal and that end of the first resistor which is not connected to the third terminal. By means of the amplifier arrangement in accordance with the invention it is possible to drive the output of the arrangement to substantially the second supply voltage, so that a considerably higher efficiency is obtained than with the known arrangement.

It is to be noted that U.S. Pat. No. 4,001,707 describes a class-G amplifier whose circuit design bears some resemblance to the circuit arrangement in accordance with the invention, but whose operation differs from that of the arrangement in accordance with the invention. In this known amplifier no diodes are arranged between the bases of the first transistor and the second transistor, but instead a resistor having a high resistance is included. However, this resistor prevents the first transistor from being saturated after the second transistor has been driven into saturation. The voltage drop across this resistor limits the output voltage swing of the arrangement to a considerable extent.

A preferred embodiment of the invention is characterized in that the first transistor and the second transistor are each constituted by a Darlington pair and between the point between the third semiconductor junction and the fourth semiconductor junction and the base of the first transistor a fifth semiconductor junction is arranged in series with the second semiconductor junction and the third semiconductor junction, which fifth semiconductor junction is poled in the same direction as the second semiconductor junction and the third semiconductor junction.

A further embodiment is characterized in that the arrangement comprises a third transistor which is arranged as an emitter follower, which transistor has its emitter coupled to the bases of the first transistor and the second transistor and which has a base to which the input signal is applied. When the second transistor is turned on the input resistance of the arrangement is substantially halved, which gives rise to switching distortion. By driving the first transistor and the second transistor via an emitter follower, the input resistance of the arrangement is increased, thereby reducing the switching distortion. This embodiment may be characterized further in that the third transistor is of a conductivity type opposite to that of the first transistor and the second transistor and, by means of a second current source, has its emitter coupled to that end of the first resistor which is not connected to the third terminal. As in the amplifier arrangement in accordance with the invention the first current source drives the second semiconductor junction and the third semiconductor junction into conduction, the emitter-follower transistor may be of a conductivity type opposite to that of the first transistor and the second transistor.

As the voltage on that end of the first transistor which is not connected to the third terminal varies with the input voltage, the first current source and the second current source, in accordance with a further embodiment, may be replaced by a second resistor and a third resistor, respectively.

The amplifier arrangement in accordance with the invention is very suitable for use in a push-pull amplifier, which may be characterized in that it comprises a first amplifier arrangement and a complementary second amplifier arrangement, in which the emitters of the complementary first transistors of the first amplifier arrangement and the second amplifier arrangement are connected to a common first terminal for connection to a common load, in which the second terminal and the third terminal of the first amplifier arrangement serve for applying the positive first supply voltage and the positive second supply voltage respectively, and in which the second terminal and the third terminal of the second amplifier arrangement serve for applying the negative first supply voltage and the negative second supply voltage respectively. If the amplifier arrangements are each driven by a respective third transistor which is arranged as an emitter follower and which is of a conductivity type opposite to that of the corresponding first transistor and the corresponding second transistor, this push-pull amplifier may be characterized further in that in the first amplifier arrangement and the second amplifier arrangement the emitter of the third transistor is connected directly to the base of the first transistor, and the collectors of the complementary third transistors are coupled to the common first terminal. By connecting the emitters of the third transistors directly to the first transistors, only two diodes are required between the bases of the third transistors in order to obtain class-AB operation of the push-pull amplifier. In comparison with the known arrangement this yields a substantial reduction in the number of diodes necessary for such operation.

Another embodiment is characterized in that the collector-emitter path of a further transistor is arranged between the bases of the complementary first transistors, a first further resistor being arranged between the base and the emitter and a second further resistor between the base and the collector of said fourth transistor. The further transistor together with the further resistors constitutes an artificial zener diode, which replace the diodes between the bases of the third transistors in order to obtain class-AB operation. This results in a substantially reduced temperature dependence of the quiescent-current setting. In this embodiment one of the third transistors may be dispensed with if the push-pull amplifier is characterized in that the base of the first transistor of one of the two amplifier arrangements is connected to the emitter of a second further transistor which is of a conductivity type opposite to that of the relevant first transistor and which is arranged as an emitter follower, a first further current source connecting the emitter of the second further transistor to that end of the first resistor of the relevant amplifier arrangement which is not connected to the third terminal and a second further current source connecting the base of that first transistor which is not connected to the second further transistor to that end of the first resistor of the relevant amplifier arrangement which is not connected to the third terminal.

BRIEF DESCRIPTION OF THE DRAWING

Embodiments of the invention will now be described in more detail, by way of example, with reference to the accompanying drawings, in which.

DESCRIPTION OF THE PREFERRED EMBODIMENTS

Figure 1:
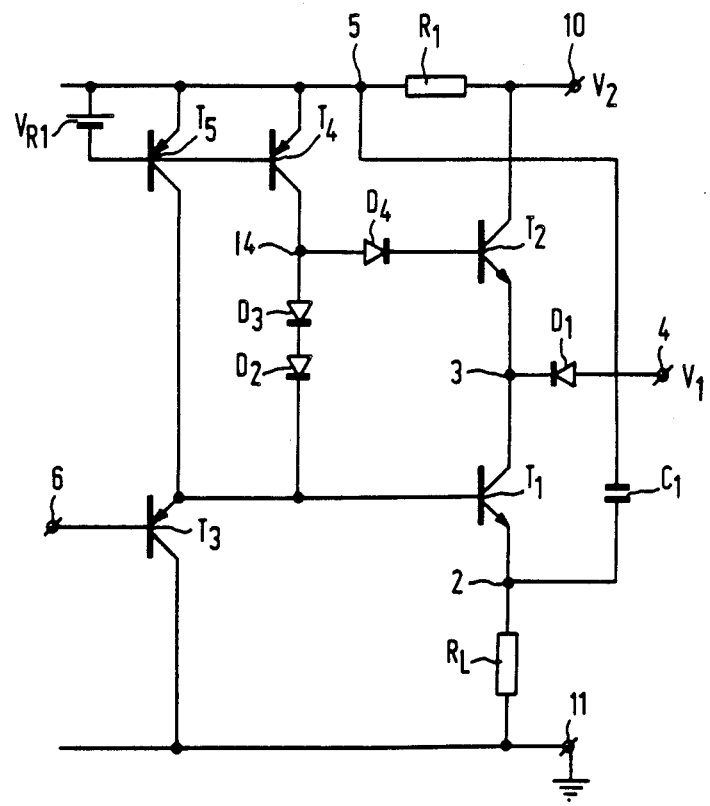
FIG. 1 is a basic diagram of an amplifier arrangement in accordance with the invention.

FIG. 1 is a basic diagram of an amplifier arrangement in accordance with the invention. The arrangement comprises a first NPN transistor $T_1$, whose emitter is connected to the output 2, to which a load $R_L$ is connected. A first diode $D_1$ connects the collector of the transistor $T_1$ to a terminal 4 for a first supply voltage $V_1$. The collector-emitter path of a second NPN transistor $T_2$ is connected in series with the collector-emitter path of the transistor $T_1$. The transistor $T_2$ has its collector connected to a terminal 10 for a second supply voltage $V_2$ which is higher than the first supply voltage $V_1$. The series arrangement of the diodes $D_2$, $D_3$ and $D_4$ is arranged between the base of the transistor $T_1$ and the base of the transistor $T_2$, the diodes $D_2$ and $D_3$ being poled in the same direction as the base-emitter junction of the transistor $T_1$ and the diode $D_4$ being poled in the same direction as the base-emitter junction of the transistor $T_2$. The terminal 10 for the supply voltage $V_2$ is connected to the junction point 14 of the third diode $D_3$ and the fourth diode $D_4$ by means of the series connection of a resistor $R_1$ and the emitter-collector path of a PNP transistor $T_4$. The base of the transistor $T_4$ is connected to a reference voltage $V_{R1}$ and constitutes a current source. The junction point 5 of the emitter of the transistor $T_4$ and the resistor $R_1$ is connected to the output 2 of the amplifier arrangement by means of a capacitor $C_1$. The base of the transistor $T_1$ is connected to the emitter of an emitter-follower transistor $T_3$. The emitter of this transistor is connected to the junction point 5 by means of a current source comprising a transistor $T_5$ whose base is at the reference voltage $V_{R1}$. The collector of the transistor $T_3$ is connected to the terminal 11, which is common to the first supply voltage $V_1$ and the second supply voltage $V_2$.

The arrangement operates as follows. The input voltage $V_i$ is applied to the base 6 of the transistor $T_3$. For low input voltages $V_i$ the voltage on the anode of the diode $D_4$ is lower than the first supply voltage $V_1$ so that the transistor $T_2$ is cut off. The collector of the transistor $T_1$ is then connected to the first supply voltage $V_1$ via the diode $D_1$. The input voltage $V_i$ on the base of the transistor $T_1$ appears also on the output 2 and is applied to the junction point 5 via the bootstrap capacitor $C_1$. As a result of this, the voltages on the emitter and the collector of the transistor $T_4$ vary in the same way with the input voltage $V_i$. The same applies to the voltages on the emitter and the collector of the transistor $T_5$. In this situation if the base current of the transistor $T_1$ is ignored, the entire current from the current source $T_4$ is applied to the transistor $T_3$ via the diodes $D_3$ and $D_2$. When the input voltage $V_i$ increases the diode $D_4$ and the transistor $T_2$ will be turned on above a specific voltage. As a result of this, the voltage on the emitter 3 of the transistor $T_2$ also increases so that the diode $D_1$ is turned off at a specific voltage. The collector of the transistor $T_1$ is then connected to the second supply voltage $V_2$ via the collector-emitter path of the transistor $T_2$. The current from the current source $T_4$ through the diode $D_4$ increases and the current through the diodes $D_3$ and $D_2$ decreases. As the input voltage $V_i$ increases further, the voltage on the base of the transistor $T_2$ becomes higher than the supply voltage $V_2$, so that the transistor $T_2$ is saturated. Since the voltage on the emitter 5 of the transistor $T_4$ varies with the input voltage via the bootstrap capacitor $C_1$, the transistor $T_4$ cannot be saturated. Subsequently, the transistor $T_1$ is bottomed, enabling the input voltage to increase until the situation is obtained in which the entire current from the current source $T_5$ flows into the base of the transistor $T_1$ and no current flows in the transistor $T_3$. The input voltage then cannot increase any further so that the maximum output voltage is reached. The voltage $V_0$ at the output 2 is then equal to:

$$V_{0MAX} = V_2 - (V_{CEST2} + V_{CEST1}) \quad (1)$$

where $V_{CEST1}$ = the collector-emitter voltage of the transistor $T_1$ in the case of saturation, and $V_{CEST2}$ = the collector-emitter voltage of the transistor $T_2$ in the case of saturation.

As the voltages $V_{CEST2}$ and $V_{CEST1}$ are substantially 100 mV, it follows from the above equation that the output 2 can be driven to substantially the second supply voltage $V_2$. As a result of this large output voltage swing the amplifier arrangement has a high efficiency.

It is to be noted that, in principle, it is possible to drive the bases of the first transistor $T_1$ and the second transistor $T_2$ directly from a signal source without the inclusion of an emitter-follower transistor $T_3$. However, this has the disadvantage that the input resistance of the arrangement is substantially halved when the transistor $T_2$ is turned on, which gives rise to switching distortion.

Further, it is to be noted that if driving is effected by means of an emitter-follower transistor $T_3$, the emitter of this transistor may in principle be connected to any point between the anode of the diode $D_4$ and the base of the transistor $T_1$. However, the present method of connecting the emitter of the transistor $T_3$ to the cathode of the diode $D_2$ has the advantage that changing over from the first supply voltage $V_1$ to the second supply voltage $V_2$ is effected at the instant at which the transistor $T_1$ is saturated, so that the transistor $T_1$ is driven to an optimum extent.

Figure 2:
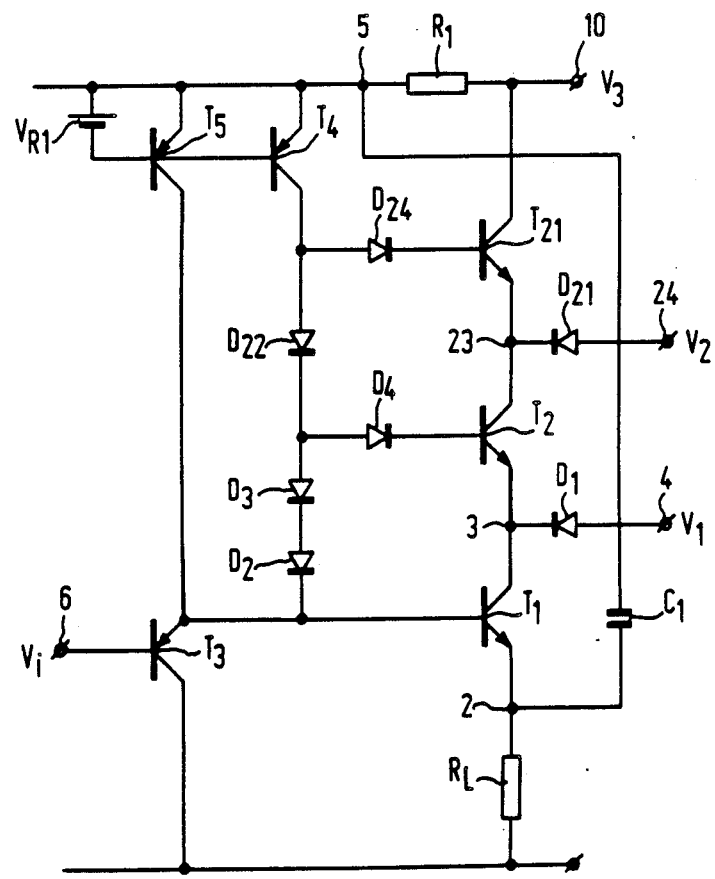
FIG. 2 is the circuit diagram of an amplifier arrangement derived from the arrangement shown in FIG. 1.

The principle of using two supply voltages as explained with reference to FIG. 1 may be extended to an arbitrary number of supply voltages. FIG. 2 shows an amplifier arrangement in accordance with the invention using three supply voltages, in which Figure identical parts bear the same reference numerals as in FIG. 1. A transistor $T_{21}$, whose collector is connected to a third supply voltage $V_3$, is arranged in series with the collector-emitter path of the transistor $T_2$. The collector of the transistor $T_2$ is connected to the second supply voltage $V_2$ via a diode $D_{21}$ and the current-source transistors $T_4$ and $T_5$ are connected to the third supply voltage $V_3$. The driver circuit for the transistor $T_{21}$ is of the same type as that for the transistor $T_2$. Again the series arrangement of three diodes $D_4$, $D_{22}$ and $D_{24}$ is arranged between the base of the transistor $T_2$ and the base of the transistor $T_{21}$, the diodes $D_4$ and $D_{22}$ being poled in the same direction as the base-emitter junction of the transistor $T_2$ and the diode $D_{24}$ being poled in the same direction as the base-emitter junction of the transistor $T_{21}$.

The operation of the arrangement can be explained simply by means of the principle described with reference to FIG. 1. As the current-source transistor $T_4$ drives the diodes $D_{22}$, $D_3$ and $D_2$ into conduction, the input voltage $V_i$ appears on the anode of the diode $D_{24}$ and the anode of the diode $D_4$. For input voltages $V_i$ lower than the supply voltage $V_1$ the transistors $T_{21}$ and $T_2$ are cut off. The collector of the transistor $T_1$ is then connected to the supply voltage $V_1$ via the diode $D_1$. The voltage on the output 2 is applied to point 5 via the bootstrap capacitor $C_1$ so that the voltage on the emitter of the transistor $T_4$ varies with the input voltage. Above an input voltage $V_i$ equal to the supply voltage $V_1$ the transistor $T_2$ is turned on. For a specific input voltage $V_i$ the diode $D_1$ is then cut off and the collector of the transistor $T_1$ is conneccted to the supply voltage $V_2$. As the input voltage $V_i$ increases further, the transistor $T_{21}$ is turned on and the diode $D_{21}$ is turned off above a specific voltage, so that the collector of the transistor $T_1$ is coupled to the supply voltage $V_3$. If the input voltage $V_i$ increases still further, the transistors $T_{21}$, $T_2$ and $T_1$ are consecutively bottomed. Bootstrapping the output voltage to the emitter of the transistor $T_4$ then prevents this transistor from being saturated. The maximum voltage $V_0$ on the output 2 is now equal to:

$$V_{0MAX} = V_2 = (V_{CEST21} + V_{CEST2} + V_{CEST1}) \quad (2)$$

where $V_{CEST21}$ = the collector-emitter voltage of the transistor $T_{21}$ in the case of saturation.

Figure 3:
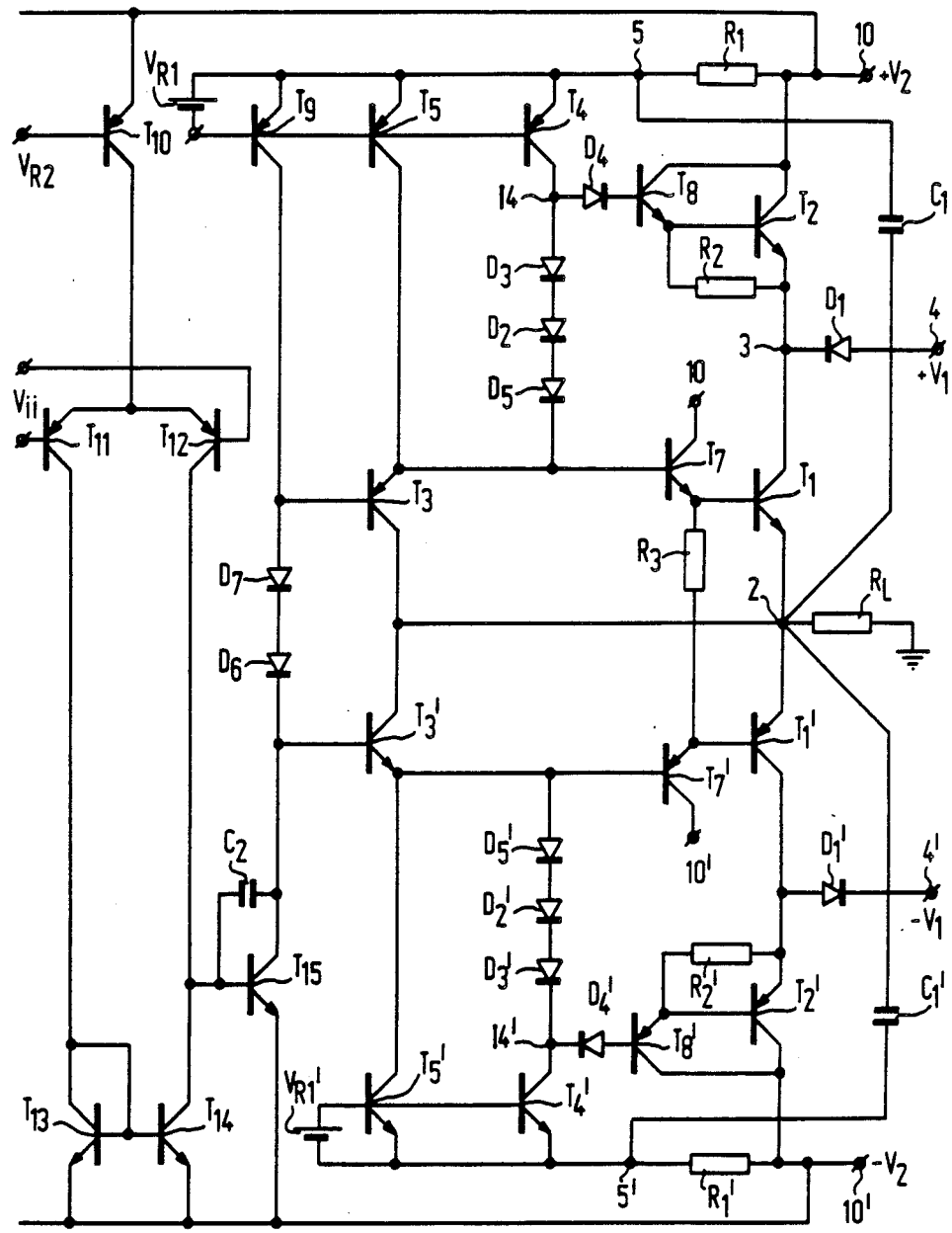
FIG. 3 shows a push-pull amplifier in accordance with a first embodiment of the invention.

The amplifier arrangement in accordance with the invention is very suitable for use in a push-pull amplifier, of which FIG. 3 shows a first embodiment. The push-pull amplifier comprises an input stage, which in the present embodiment has its simplest form and comprises two transistors $T_{11}$ and $T_{12}$ arranged as a differential pair, whose common emitter terminal is connected to the positive second supply voltage $+V_2$ by means of a current source comprising a transistor $T_{10}$ whose base is at a reference voltage $V_R$. The input signal $V_{ii}$ of the push-pull amplifier is applied between the bases of the transistors $T_{11}$ and $T_{12}$. The collector of the transistor $T_{12}$ is connected directly to the output of the input stage and the collector of the transistor $T_{11}$ is connected to the said output by means of a current mirror comprising the transistors $T_{13}$ and $T_{14}$, which output is connected to the input of a Miller stage. In the present example, this Miller stage comprises a transistor $T_{15}$ whose emitter is connected to the negative supply voltage $-V_2$. A frequency-compensation capacitor $C_2$ is arranged between the collector and the base of the transistor $T_{15}$. The collector of the transistor $T_{15}$ is connected to the positive supply voltage $+V_2$ via a resistor $R_1$ and by the series arrangement of two diodes $D_6$ and $D_7$ and a current source comprising the transistor $T_9$, whose base is at a reference voltage $V_{R1}$. The output stage comprises two complementary circuits which are each substantially identical to the circuit arrangement shown in FIG. 1. Therefore, identical parts bear the same reference numerals as in FIG. 1, the complementary parts being denoted by primes. The arrangement differs from that shown in FIG. 1 with respect to the following points. The transistor $T_2$ and the transistor $T_8$ are arranged as a Darlington pair, a resistor $R_2$ being arranged between the base and the emitter of the transistor $T_2$ to provide a rapid turn-off of the Darlington pair. It is to be noted that a resistor or a diode may be arranged between the base and the emitter of the transistor $T_8$ for protection purposes, and in the case of a diode its forward direction should be opposite to that of the base-emitter junction of the transistor $T_8$. Similarly, the transistor $T_1$ forms a Darlington pair with a transistor $T_7$. Therefore, an additional diode $D_5$ must be arranged in series with the diodes $D_2$ and $D_3$ to prevent this Darlington pair from being saturated when the Darlington pair $T_8,T_2$ is not yet fully conductive. The emitters of the complementary output transistors $T_1$ and $T_1'$ are connected to the common output 2, to which the load $R_L$ is connected. A resistor $R_3$ is arranged between the emitters of the transistors $T_7$ and $T_7'$ and has the same function as the resistor $R_2$.

The collectors of the transistors $T_3$ and $T_3'$ are interconnected and are also connected to the output 2. It is to be noted that the collectors of the transistors $T_3$ and $T_3'$ may alternatively be connected to the emitter of the transistor $T_7'$ and the emitter of the transistor $T_7$, respectively or, if resistors having low resistance values are arranged in the emitter lines of the transistors $T_1$ and $T_1'$, to the emitter of the transistor $T_1'$ and the emitter of the transistor $T_1$, respectively. The output signal of the Miller stage is applied to the bases of the transistors $T_3$ and $T_3'$. The diodes $D_6$ and $D_7$ between the bases of the transistors $T_3$ and $T_3'$ provide the class-AB operation of the output stage.

Since the diodes $D_2$, $D_3$ and $D_5$ are driven into conduction by the current source $T_4$, the output of the emitter-follower transistor $T_3$ may be connected to the base of the transistor $T_7$ and the transistor $T_3$ may be a PNP transistor. As a result of this, only two diodes ($D_6$ and $D_7$) are necessary between the bases of the transistors $T_3$ and $T_3'$ for the quiescent-current setting. In the known arrangement using Darlington transistors, ten diodes between the bases of the emitter follower transistors are necessary for the quiescent-current setting. This means that the arrangement in accordance with the invention provides a substantial reduction in the number of diodes. The push-pull principle is known per se and will therefore not be discussed in more detail here. As the transistor $T_2$ together with the transistor $T_8$ constitutes a Darlington pair, the maximum output voltage is now equal to:

$$V_{0MAX} = +V_2 - (V_{CEST8} + V_{BET2} + V_{CEST1}) \qquad (3)$$

where $V_{BET2}$ = the base emitter voltage of the transistor $T_2$.

This means that the maximum output voltage is one base-emitter voltage lower than in the case of FIG. 1. The minimum output voltage lies equally far above the negative supply voltage $-V_2$ as the maximum output voltage lies below the positive supply voltage $+V_2$.

A push-pull amplifier in accordance with a second embodiment of the invention will be described with reference to FIG. 4. For the sake of simplicity only the output stage which is relevant to the invention is shown and identical parts bear the same reference numerals as in FIG. 3.

In the present embodiment the current-source transistor $T_4$ is replaced by a resistor $R_4$ and the current-source transistor $T_5$ is replaced by a resistor $R_5$. The bootstrap capacitor $C_1$ ensures that the signal voltage on the junction point 5 is the same as the signal voltage on the anode 4 of the diode $D_4$ and the emitter of the transistor $T_3$. The voltages across the resistance $R_4$ and $R_5$ are therefore constant, so that these resistors again function as current sources.

A push-pull amplifier in accordance with a third embodiment is described with reference to FIG. 5, in which identical parts bear the same reference numerals as in FIG. 4. An artificial zener diode is arranged between the bases of the transistors $T_7$ and $T_7'$. This artificial zener diode comprises a transistor $T_6$ between whose collector and base a resistor $R_6$ is arranged and between whose base and emitter a resistor $R_7$ is arranged. The voltage across this transistor $T_6$ is:

$$V_{CET6} = (1 + R_6/R_7)V_{BET6} \qquad (4)$$

where $V_{CET6}$ = the collector-emitter voltage of the transistor $T_6$, $V_{BET6}$ = the base-emitter voltage of the transistor $T_6$.

The resistors $R_6$ and $R_7$ are so chosen that a voltage equal to four diode voltages appears between the bases of the transistors $T_7$ and $T_7'$ for the quiescent-current setting of the transistors $T_7$, $T_1$ and $T_7'$, $T_1'$. The artificial zener diode has the advantage that its temperature dependence is much smaller than that of four series-connected diodes. Moreover, the artificial zener diode between the bases of the transistors $T_7$ and $T_7'$ enables one of the emitter-follower transistors $T_3$ and $T_3'$ to be dispensed with. In the present example the transistor $T_3$ is dispensed with. The base of the transistor $T_7$ is now only connected to the positive supply voltage $+V_2$ by means of a resistor $R_8$, which again operates as a current source. The collector of the transistor $T_3'$ is also connected to the positive supply voltage. The base 6 of the transistor $T_3'$ may be connected directly to the collector of the transistor $T_{15}$ (see FIG. 3), without diodes for the quiescent-current setting being arranged in the collector line. The input voltage on the base of the transistor $T_3'$ appears on the base of the transistor $T_7'$ and, via the artificial zener diode $T_6$, $R_6$ and $R_7$, also on the base of the transistor $T_7$, so that the transistors $T_7$ and $T_7'$ are again driven in the same way.

It is to be noted that it is alternatively possible not to dispense with the transistor $T_3$ and to connect the base of the transistor $T_7'$ to the negative supply voltage $-V_2$ by means of a resistor $R_8'$.

Figure 6:
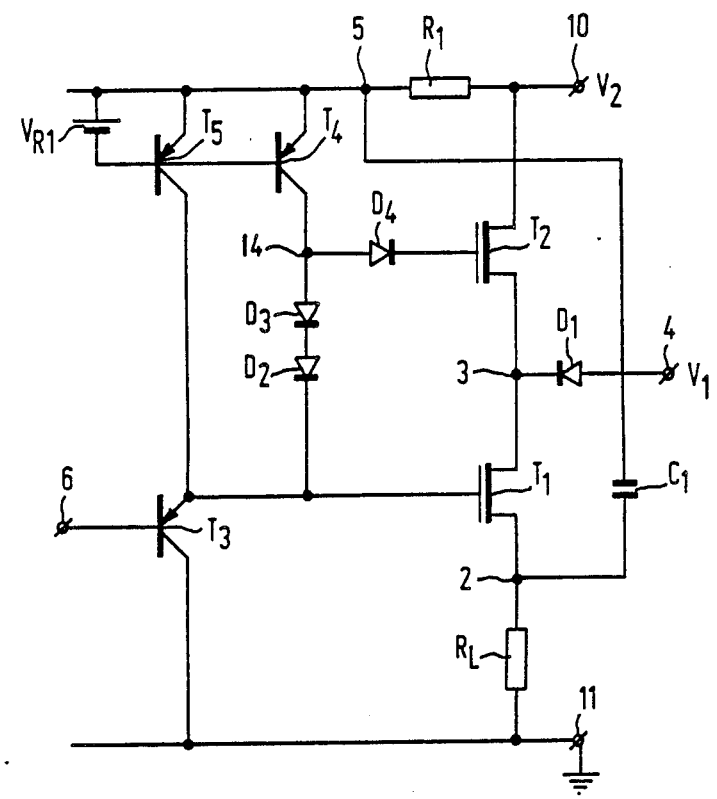
FIG. 6 shows a hybrid version of the amplifier of FIG. 1 utilizing both bipolar and field-effect transistors.

The invention is not limited to the embodiments shown. Within the scope of the invention many modifications will become obvious to those skilled in the art. For example, the diodes employed in the present embodiments may be replaced by diode-connected transistors. Further, all or some of the bipolar transistors in the arrangement may be replaced by MOS transistors, as shown, for example, in FIG. 6 which is a hybrid version of the amplifier of FIG. 1. In the case of an FET, "emitter", "collector" and "base" should now read "source", "drain" and "gate".

Figure 4:
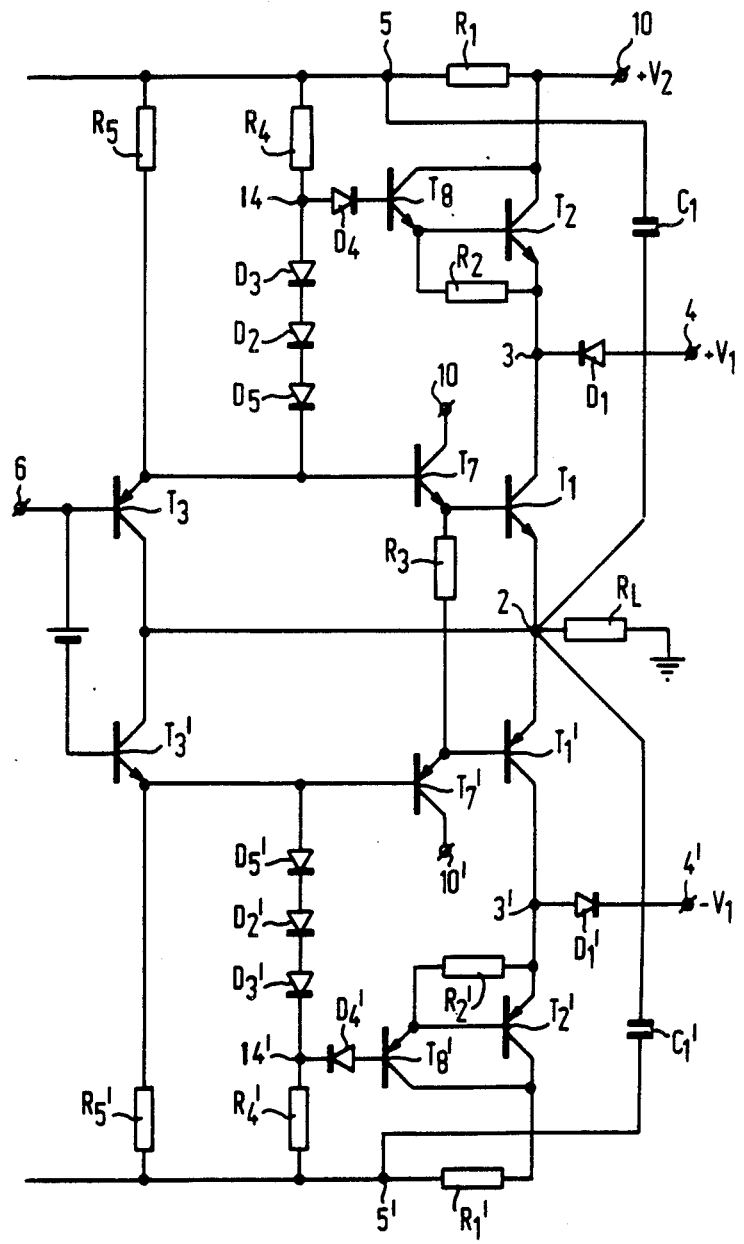
FIG. 4 shows a push-pull amplifier in accordance with a second embodiment of the invention.
Figure 5:
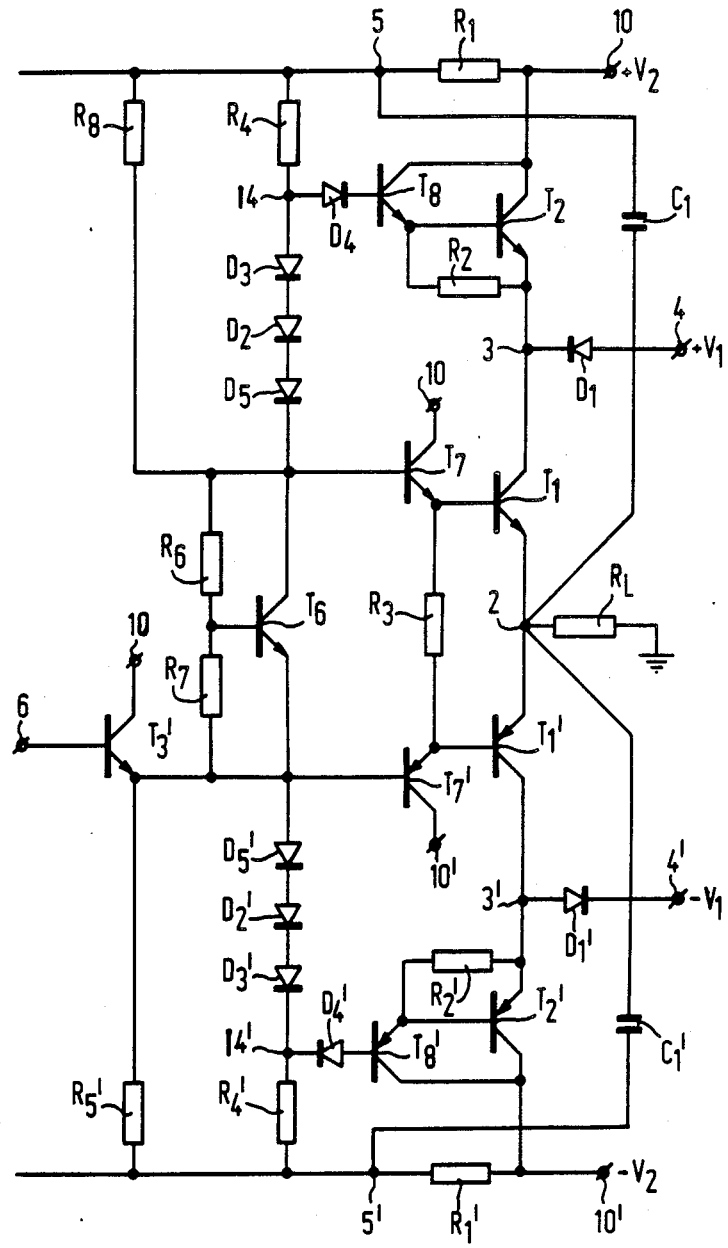
FIG. 5 shows a push-pull amplifier in accordance with a third embodiment of the invention.

Finally, it is to be noted that the push-pull amplifier shown in FIGS. 3, 4 and 5 may also be constructed using the amplifier arrangement shown in FIG. 2.

What is claimed is:

1. An amplifier arrangement comprising:
   a first transistor having an emitter coupled to a first terminal for connection to a load which is coupled to a reference point, and a collector coupled by means of a first semiconductor junction to a second terminal for a first supply voltage,
   a second transistor having a collector-emitter path connected in series with the collector-emitter path of the first transistor, and having a collector coupled to a third terminal for a second supply voltage which is higher than the first supply voltage,
   a circuit coupled between a base of the first transistor and a base of the second transistor which comprises a series arrangement of at least a second semiconductor junction and a third semiconductor junction poled in the same direction as the base-emitter junction of the first transistor, and a fourth semiconductor junction which is poled in the same direction as the base-emitter junction of the second transistor, and
   an input coupled to the base of the first transistor and the second transistor for receiving an input signal, characterized in that
   the third terminal is coupled to a point between the third semiconductor junction and the fourth semiconductor junction by means of the series arrangement of a first resistor and a first current source, and
   a capacitor is coupled between the first terminal and that end of the first resistor which is not connected to the third terminal.

2. An amplifier arrangement as claimed in claim 1, characterized in that the first transistor and the second transistor each comprise a Darlington pair and between the point between the third semiconductor junction and the fourth semiconductor junction and the base of the first transistor a fifth semiconductor junction is connected in series with the second semiconductor junction and the third semiconductor junction, the fifth semiconductor junction being poled in the same direction as the second semiconductor junction and the third semiconductor junction.

3. An amplifier arrangement as claimed in claim 2, characterized in that the first current source comprises a second resistor.

4. An amplifier arrangement as claimed in claim 1, characterized in that the arrangement comprises a third transistor connected as an emitter follower, said third transistor having its emitter coupled to the bases of the first transistor and the second transistor and a base to which the input signal is applied.

5. An amplifier arrangement as claimed in claim 4, characterized in that the third transistor is of a conductivity type opposite to that of the first transistor and the second transistor and, by means of a second current source, has its emitter coupled to that end of the first resistor which is not connected to the third terminal.

6. An amplifier arrangement as claimed in claim 5 characterized in that the second current source comprises a third resistor.

7. An amplifier arrangement as claimed in claim 1 wherein the first current source comprises a second resistor.

8. An amplifier comprising: first, second and third terminals for connection to a load, a first supply voltage and a second supply voltage, respectivey, where the second supply voltage is higher than the first supply voltage, first and second transistors connected in series between the first and third terminals, a first semiconductor junction coupling the second terminal to a first junction point between the first and second transistors, a circuit coupled between a control electrode of the first transistor and a control electrode of the second transistor, said circuit including a series arrangement of second, third and fourth semiconductor junctions with the second and third semiconductor junctions poled in the same direction as the junction between the control electrode and a first main electrode of the first transistor and with the fourth semiconductor junction poled in the same direction as the junction between the control electrode and a first main electrode of the second transistor, a signal input terminal coupled to the control electrode of the first transistor and the second transistor, means including a series circuit of a first resistor and a first current source for coupling the third terminal to a second junction point between the third and fourth semiconductor junctions, and a capacitor coupled between the first terminal and a third junction point between the first resistor and the first current source.

9. An amplifier as claimed in claim 8 wherein the first current source comprises a second resistor.

10. An amplifier as claimed in claim 9 further comprising a third transistor connected as an emitter-follower with its base coupled to the signal input terminal and its emitter coupled to the control electrodes of the first and second transistors.

11. An amplifier as claimed in claim 10 wherein the third transistor is of a conductivity type opposite to that of the first and second transistors, and a second current source coupling the emitter of the third transistor to said third junction point.

12. An amplifier as claimed in claim 8 further comprising a fifth semiconductor junction poled in the same direction as the second and third semiconductor junctions and connected in series therewith between the second junction point and the control electrode of the first transistor.

13. An amplifier as claimed in claim 8 wherein at least one of said transistors comprises a field effect transistor.

14. A push-pull amplifier comprising: first, second and third terminals for connection to a load, a first supply voltage and a second supply voltage, respectively, where the second supply voltage is higher than the first supply voltage, first and second transistors connected in series between the first and third terminals, a first semiconductor junction coupling the second terminal to a first junction point between the first and second transistors, a circuit coupled between a control electrode of the first transistor and a control electrode of the second transistor, said circuit including a series arrangement of second, third and fourth semiconductor junctions with the second and third semiconductor junctions poles in the same direction as the junction between the control electrode and a first main electrode of the first transistor and with the fourth semiconductor junction poled in the same direction as the junction between the control electrode and a first main electrode of the second transistor, fourth and fifth terminals for connection to third and fourth supply voltages, respectively, of opposite polarity to said first and second supply voltages, respectively, and with the fourth supply voltage being higher than the third supply voltage, third and fourth transistors serially connected between the fifth and first terminals, signal input means coupled to control electrodes of the first, second, third and fourth transistors, a circuit coupled between a control electrode of the third transistor and a control electrode of the fourth transistor, said circuit including a series arrangement of fifth, sixth and seventh semiconductor junctions poled in the same relation to the third and fourth transistors as are the second, third and fourth semiconductor junctions to the first and second transistors, an eighth semiconductor junction coupling the fourth terminal to a further first junction point between the third and fourth transistors, means including a series circuit of a first resistor and a first current source for coupling the third terminal to a second junction point between the third and fourth semiconductor junctions, means including a series circuit of a second resistor and a second current source for coupling the fifth terminal to a further second junction point between the sixth and seventh semiconductor junctions, a first capacitor coupled between the first terminal and a third junction point between the first resistor and the first current source, and a second capacitor coupled between the first terminal and a further third junction point between the second resistor and the second current source, and wherein at least said first and third transistors are complementary transistors.

15. A push-pull amplifier as claimed in claim 14 wherein the signal input means comprise fifth and sixth complementary transistors each connected as an emitter-follower with the emitter of the fifth transistor connected directly to the control electrode of the first transistor and the emitter of the sixth transistor connected directly to the control electrode of the third transistor, said fifth and sixth transistors each having a base to which the input signal is applied and a collector coupled to the first terminal.

16. A push-pull amplifier as claimed in claim 14 characterized in that the collector-emitter path of a further transistor is connected between the bases of the complementary first and third transistors, a first further resistor being connected between the base and the emitter and a second further resistor being connected between the base and the collector of said further transistor.

17. A push-pull amplifier as claimed in claim 16, characterized in that the base of the first transistor is connected to the emitter of a second further transistor which is of a conductivity type opposite to that of the first transistor and which is connected as an emitter follower, a first further current source connecting the emitter of the second further transistor to that end of the first resistor which is not connected to the third terminal and a second further current source connecting the base of the third transistor to that end of the second resistor which is not connected to the fifth terminal.

18. A push-pull amplifier as claimed in claim 17, characterized in that the first further current source and the second further current source comprise a third further resistor and a fourth further resistor respectively.

* * * * *